US010771056B2

United States Patent
Tao et al.

(10) Patent No.: US 10,771,056 B2
(45) Date of Patent: Sep. 8, 2020

(54) SWITCH CIRCUIT AND HIGH-SPEED MULTIPLEXER-DEMULTIPLEXER

(71) Applicant: LONTIUM SEMICONDUCTOR CORPORATION, Hefei, Anhui (CN)

(72) Inventors: Cheng Tao, Anhui (CN); Hongfeng Xia, Anhui (CN); Yu Chen, Anhui (CN); Xiangyu Ji, Anhui (CN); Jiaxi Fu, Anhui (CN)

(73) Assignee: LONTIUM SEMICONDUCTOR CORPORATION, Hefei, Anhui (CN)

( * ) Notice: Subject to any disclaimer, the term of this patent is extended or adjusted under 35 U.S.C. 154(b) by 0 days.

(21) Appl. No.: 16/660,136

(22) Filed: Oct. 22, 2019

(65) Prior Publication Data

US 2020/0136609 A1 Apr. 30, 2020

(30) Foreign Application Priority Data

Oct. 29, 2018 (CN) .......................... 2018 1 1268024

(51) Int. Cl.
 *H03K 17/62* (2006.01)
 *H03K 17/687* (2006.01)
 *H04J 3/04* (2006.01)
(52) U.S. Cl.
 CPC ....... *H03K 17/687* (2013.01); *H03K 17/6257* (2013.01); *H04J 3/047* (2013.01)

(58) Field of Classification Search
 CPC .... H03K 17/6257; H03K 17/687; H04J 3/047
 USPC ....... 327/379, 389, 407, 408, 419, 427, 434, 327/574, 581
 See application file for complete search history.

(56) References Cited

U.S. PATENT DOCUMENTS

2007/0009202 A1* 1/2007 Chan ...................... H01H 9/542
 385/18

* cited by examiner

*Primary Examiner* — William Hernandez
(74) *Attorney, Agent, or Firm* — Cantor Colburn LLP (57) ABSTRACT

A switch circuit and a high-speed multiplexer-demultiplexer are provided. The switch circuit includes an equalization module and an MOS transistor. A gate of the first MOS transistor is connected to an output terminal of the equalization module. An input terminal of the first MOS transistor is connected to a signal source. An output terminal of the first MOS transistor is connected to a subsequent circuit. The equalization module is configured to: supply a turning-on signal to the first MOS transistor in a case that an operation signal is acquired, to turn on the first MOS transistor; and generate a compensation signal for compensating an attenuation of the signal transmitted through the first MOS transistor, and apply the compensation signal to the gate of the first MOS transistor. The switch circuit operates in response to the operation signal.

18 Claims, 6 Drawing Sheets

FIG. 1

(Prior Art)

FIG. 2

(Prior Art)

(Prior Art)

SWITCH CIRCUIT AND HIGH-SPEED MULTIPLEXER-DEMULTIPLEXER

This application is based upon and claims the benefit of priority to Chinese Patent Application No. 201811268024.X, filed on Oct. 29, 2018 with the Chinese Patent Office, which is incorporated herein by reference in its entirety.

FIELD

The present disclosure relates to the technical field of electronic circuits, and in particular to a switch circuit and a high-speed multiplexer-demultiplexer.

BACKGROUND

In a communication system, it is often required to perform switch among data channels for high-speed data transmission. Generally, the switch is performed via a multiplexer-demultiplexer (MUX-DEMUX). The MUX-DEMUX includes a passive switch. Stray capacitance and limited on-resistance in the passive switch may cause attenuation to a signal passing through the passive switch, and the attenuation is severe for a signal with a high frequency. Therefore, a technical problem to be solved by those skilled in the art is how to solve the attenuation to the signal caused by a switch circuit.

SUMMARY

In view of this, a switch circuit and a high-speed multiplexer-demultiplexer are provided according to embodiments of the present disclosure, to solve a problem of attenuation to signals in a signal path caused by a high-speed signal switch.

A switch circuit is provided according to an embodiment of the present disclosure, which includes an equalization module and a first metal-oxide-semiconductor (MOS) transistor. A gate of the first MOS transistor is connected to an output terminal of the equalization module. An input terminal of the first MOS transistor is connected to a signal source for acquiring a signal from the signal source. An output terminal of the first MOS transistor is connected to a subsequent circuit. The equalization module is configured to: supply a turning-on signal to the first MOS transistor in a case that an operation signal in response to which the switch circuit operates is acquired, to turn on the first MOS transistor; and generate, in a case that the first MOS transistor is turned on, a compensation signal for compensating an attenuation of the signal transmitted through the first MOS transistor, and apply the compensation signal to the gate of the first MOS transistor.

In an embodiment, in the above switch circuit, the equalization module includes a first switch, a second switch, a third switch, a first resistor, a second resistor, an equalization amplifier, and a signal detecting module. A first terminal of the first switch and a first terminal of the second switch are connected to a power supply Vdd. A first terminal of the first resistor is connected to a second terminal of the second switch. A second terminal of the first resistor is connected to an output terminal of the equalization amplifier. A first terminal of the second resistor is connected to a second terminal of the first switch. A second terminal of the second resistor is connected to a first terminal of the third switch, a first terminal of the signal detecting module, and an input terminal of the equalization amplifier. A second terminal of the third switch is grounded. The output terminal of the equalization amplifier serves as the output terminal of the equalization module and is connected to the gate of the first MOS transistor. The signal detecting module is configured to: detect an amplitude of the signal transmitted through the first MOS transistor; and output, from the first terminal of the signal detecting module, a signal for characterizing the amplitude of the signal transmitted through the first MOS transistor.

In an embodiment, in the above switch circuit, the signal detecting module includes a second MOS transistor. A gate of the second MOS transistor serves as the first terminal of the signal detecting module. The second MOS transistor is connected to the first MOS transistor in parallel.

In an embodiment, in the above switch circuit, the signal detecting module includes a first capacitor. A first terminal of the first capacitor serves as the first terminal of the signal detecting module. A second terminal of the first capacitor is connected to the input terminal or the output terminal of the first MOS transistor.

In an embodiment, in the above switch circuit, in a case that the switch circuit is in an operation state, the first switch and the second switch are turned on, and the third switch is turned off. In a case that the switch circuit is not in the operation state, the first switch and the second switch are turned off, and the third switch is turned on.

In an embodiment, in the above switch circuit, design parameters of the equalization module, the first MOS transistor and the first resistor are determined according to the following equation:

$$Gm*R0 = S*Cp*R0 + 1 + Cp/Cg$$

where Gm denotes a transconductance magnification of the equalization amplifier, R0 denotes a resistance of the first resistor, S denotes a complex frequency, Cp denotes a sum of capacitances-to-ground generated at both sides of the first MOS transistor, and Cg denotes a gate oxide capacitance generated in the first MOS transistor.

In an embodiment, in the above switch circuit, design parameters of the equalization module, the first MOS transistor and the first resistor are determined according to the following equation:

$$Gm*R0 = (S*Cp*R0 + 1 + Cp/Cg)/n$$

where Gm denotes a transconductance magnification of the equalization amplifier, R0 denotes a resistance of the first resistor, S denotes a complex frequency, Cp denotes a sum of capacitances-to-ground generated at both sides of the first MOS transistor, Cg denotes a gate oxide capacitance generated in the first MOS transistor, and n>1.

In an embodiment, in the above switch circuit, a size of the first MOS transistor is greater than a size of the second MOS transistor.

In an embodiment, in the above switch circuit, n=3.

A high-speed multiplexer-demultiplexer is further provided according to an embodiment of the present disclosure, which includes at least two switch circuits described above.

With the above technical solutions according to the embodiments of the present disclosure, the first MOS transistor can be designed to have a large size, such that an on-resistance Ron of the first MOS transistor is small. A high frequency loss caused by the first MOS transistor with a large size can be compensated by directly controlling the gate of the first MOS transistor through the equalization module. In a case that the switch circuit is to be turned on, the equalization module is turned on, to control the first MOS transistor by adjusting a gate voltage of the first MOS transistor, the equalization module operates in a dynamic operation range, such that the first MOS transistor is completely conductive. In a case that the first MOS transistor is turned on, the signal from the signal source is transmitted to the subsequent circuit after passing through the first MOS transistor. In this case, the equalization module generates a compensation signal for compensating an attenuation of the signal transmitted through the first MOS transistor, and couples the compensation signal to the signal path for compensation, thereby achieving compensation on the signal in the signal path in which the first MOS transistor is located.

BRIEF DESCRIPTION OF THE DRAWINGS

In order to more clearly describe the technical solution in the embodiments of the present disclosure or the technical solution in the conventional technology, drawings to be used in the description of the embodiments of the present disclosure or the conventional technology are briefly described hereinafter. It is apparent that the drawings described below show merely the embodiments of the present disclosure, and those skilled in the art may obtain other drawings according to the provided drawings without any creative effort.

DETAILED DESCRIPTION OF EMBODIMENTS

The technical solutions in the embodiments of the present disclosure are described clearly and completely in conjunction with the drawings in the embodiments of the present disclosure hereinafter. It is apparent that the described embodiments are only some embodiments, rather than all embodiments of the present disclosure. All other embodiments obtained by those skilled in the art based on the embodiments of the present disclosure without any creative work should fall within the protection scope of the present disclosure.

Figure 1:
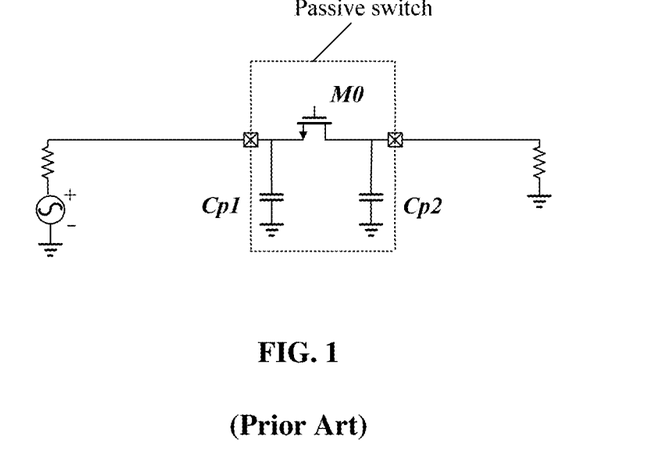
FIG. 1 is a schematic equivalent structural diagram of a passive switch in a passgate structure according to the conventional technology.

FIG. 1 is a schematic equivalent structural diagram of a passive switch in a passgate structure according to the conventional technology. Referring to FIG. 1, the passive switch may include a first MOS transistor M0, and a stray capacitance Cp1 and a stray capacitance Cp2 at two sides of the first MOS transistor M0. It is to be noted that, in practice, the first MOS transistor M0 is not ideal and has a stray capacitance. In the embodiments of the present disclosure, for convenience of describing the principle of the technical solutions, assuming that the first MOS transistor M0 is ideal, and a stray capacitance of source-drain to a substrate generated in the MOS transistor M0 is added to the stray capacitance Cp1 and the stray capacitance Cp2. Specifically, the stray capacitance Cp1 and the stray capacitance Cp2 shown in FIG. 1 represent a sum of the stray capacitance of source-drain to a substrate of the non-ideal first MOS transistor M0, and capacitances-to-ground of devices at both sides of the first MOS transistor M0, such as a stray capacitance of an electrostatic discharge (ESD) device, a stray capacitance of a pad. It is to be noted that the stray capacitance Cp1 and the stray capacitance Cp2 do not include a gate oxide capacitance of the first MOS transistor M0. Depending on an operation point in a path, the first MOS transistor M0 may be an NMOS transistor, a P-channel metal oxide semiconductor (PMOS) transistor, or a complementary metal-oxide-semiconductor (CMOS) transistor formed by the NMOS transistor and the PMOS transistor. A circuit is described herein by taking the NMOS transistor as an example. For the PMOS transistor and the CMOS transistor, reference may be made to the description of the NMOS transistor.

Figure 2:
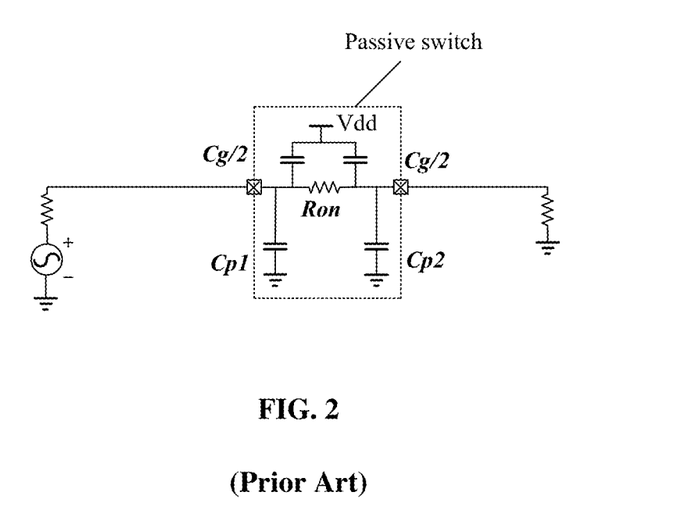
FIG. 2 is a schematic equivalent structural diagram of an N-channel metal oxide semiconductor (NMOS) transistor in a turned-on state according to the conventional technology.

Reference is made to FIG. 2, which is a schematic equivalent structural diagram of an NMOS transistor in a turned-on state according to the conventional technology, where Ron denotes a turned-on resistance of the NMOS transistor, Cg denotes a gate oxide capacitance of a gate and a channel of the NMOS transistor, and the gate of the NMOS transistor is supplied with a signal of a high level in a case that the NMOS transistor is turned on. The signal is transmitted from a signal source to the NMOS transistor via a wire, and then is transmitted to a load from the NMOS transistor. In this case, a high-speed signal may subject an attenuation, and a high-frequency signal may subject to a severe attenuation. Therefore, for an ideal switch, quality of the signal is not degraded (which means that the signal may not subject to an attenuation with the ideal switch in the present disclosure). For a preferable switch, the attenuation of the signal may be compensated. However, depending the characteristic of the NMOS transistor, the attenuation of the signal is not compensated by the NMOS transistor, and even a further attenuation may be caused to the signal under influence of the stray capacitance and the limited on-resistance Ron of the NMOS transistor. The on-resistance Ron consumes power for a signal of any frequency, and a signal with a high-frequency may be leaked to the ground due to the stray capacitances. Generally, it is desired to reduce both the stray capacitance and the on-resistance Ron. However, in a case that a minimum channel length L is determined, an NMOS transistor with a large channel width W may obtain a small on-resistance Ron, which in turn results in an increased stray capacitance, where a change of the gate oxide capacitance Cg is nearly inverse to that of the on-resistance Ron. Since the contradiction between the stray capacitance and the turn-on resistance Ron in a structure, a compromise value is determined to achieve balance between the stray capacitance and the on-resistance Ron. However, the contradiction cannot be thoroughly eliminated, and the compromise value merely reflects an upper limit in performance of the NMOS transistor with this structure.

Figure 3:
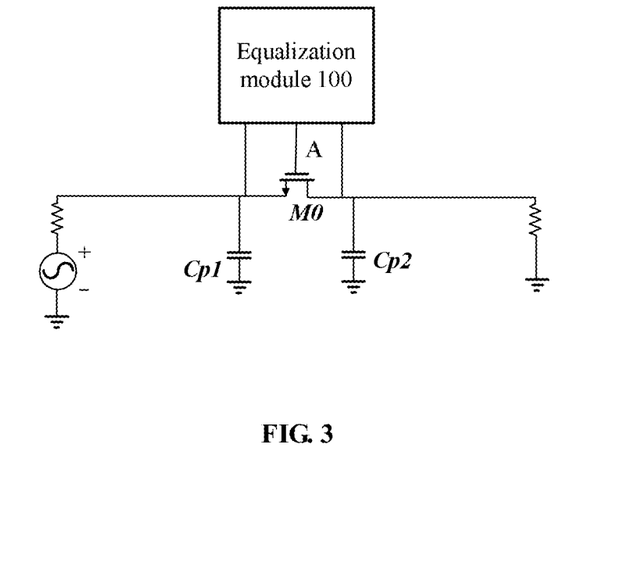
FIG. 3 is a schematic structural diagram of a switch circuit according to an embodiment of the present disclosure.

In view of this, a switch circuit is provided according to the present disclosure. Reference is made to FIG. 3, which is a schematic structural diagram of a switch circuit according to an embodiment of the present disclosure. The switch circuit includes an equalization module 100 and a first MOS transistor M0. During a design stage, the first MOS transistor M0 is principally designed to be as large as an on-resistance Ron of the first MOS transistor M0 is negligible, which is determined according to system requirements. In the technical solution according to the embodiment of the present disclosure, the on-resistance of the first MOS transistor M0 is less than 5 ohm.

As shown in FIG. 3, assuming that the first MOS transistor M0 is ideal, the first stray capacitance Cp1 and the second stray capacitance Cp2 represents a sum of capacitances-to-ground generated at two sides of the first MOS transistor M0, such as a stray capacitance of source-drain to a substrate of the MOS transistor M0, a stray capacitance of a ESD device, a stray capacitance of pad, and does not include a gate oxide capacitance of the first MOS transistor M0. An arrangement of the first MOS transistor M0, the first stray capacitance Cp1 and the second stray capacitance Cp2 is as shown in FIG. 3. A gate of the first MOS transistor M0 is connected to an output terminal of the equalization module 100. An input terminal of the first MOS transistor M0 is connected to a signal source. An output terminal of the first MOS transistor M0 is connected to a subsequent circuit. The equalization module 100 is configured to: supply a turning-on signal to the first MOS transistor M0 in a case that an operation signal in response to which the switch circuit operates is acquired, to turn on the first MOS transistor; and generate a compensation signal for compensating an attenuation of the signal transmitted through the first MOS transistor, and apply the compensation signal to the gate of the first MOS transistor M0, to supply the compensation signal to the signal transmitted through the first MOS transistor M0 through the gate of the first MOS transistor M0, thereby compensating the attenuation to the signal.

With the technical solutions according to the above embodiment of the present disclosure, the first MOS transistor M0 may be designed to have a large size, to make the on-resistance Ron of the first MOS transistor M0 is small. A high-frequency loss caused by the first MOS transistor M0 with a large size is compensated by an active element (for example, the equalization module 100), such that a contradiction between the on-resistance Ron and the stray capacitance in a common passgate structure is eliminated by directly controlling the gate of the first MOS transistor M0 through the equalization module 100. In a case that the switch circuit is to quit the operation state, the equalization module 100 adjusts a gate voltage of the first MOS transistor M0, to turn off the first MOS transistor M0. In a case that the switch circuit is to be in the operation state, the equalization module 100 is turned on and adjusts the gate voltage of the first MOS transistor M0, to control the first MOS transistor M0. The equalization module 100 operates in a dynamic operation range, such that the first MOS transistor M0 is completely conductive (for example, a static operation voltage at a point A is set to approximate 3V in a case that the voltage Vdd is equal to 3.3V). In a case that the first MOS transistor M0 is turned on, the signal from the signal source is transmitted to the subsequent circuit after passing through the first MOS transistor M0. In this case, the equalization module 100 detects an amplitude of a signal in a signal path in which the first MOS transistor M0 is located, and amplifies the detected signal. The amplified signal is applied to the gate of the first MOS transistor M0 as a compensation signal. The compensation signal is coupled to the signal path via the gate oxide capacitance of the first MOS transistor M0 for compensation, thereby achieving compensation on the signal in the signal path in which the first MOS transistor M0 is located.

In the technical solution according to the above embodiment of the present disclosure, the first MOS transistor M0 may be an NMOS transistor, a PMOS transistor, or a CMOS transistor, which is determined according to user demands. For convenience of description, the technical solutions according to the embodiments of the present disclosure is described hereinafter by taking a case that the MOS transistor is an NMOS transistor as an example. Those skilled in the art may replace the first MOS transistor M0 with the PMOS transistor or the CMOS transistor in combination with characteristics of other MOS transistors, to modify the technical solutions. Those modified technical solutions should fall within the scope of the present disclosure. In an embodiment, the first MOS transistor M0 is the NMOS transistor, in a case that the switch circuit is to quit the operation state, the equalization module 100 is turned off, and a voltage at the point A is in turn pulled down, to pull down the gate voltage of the first MOS transistor M0, so as to turn off the first MOS transistor M0. In a case that the switch circuit is to operate in the operation state, the equalization module 100 is turned on, and a direct current (DC) operation voltage (the gate voltage of the first MOS transistor M0) at the point A is offset to have a high level, and the equalization module 100 operates in the dynamic operation range, such that the first MOS transistor M0 is turned on (for example, the static operation voltage at the point A is set to approximate 3V in a case that Vdd is equal to 3.3V).

Figure 4:
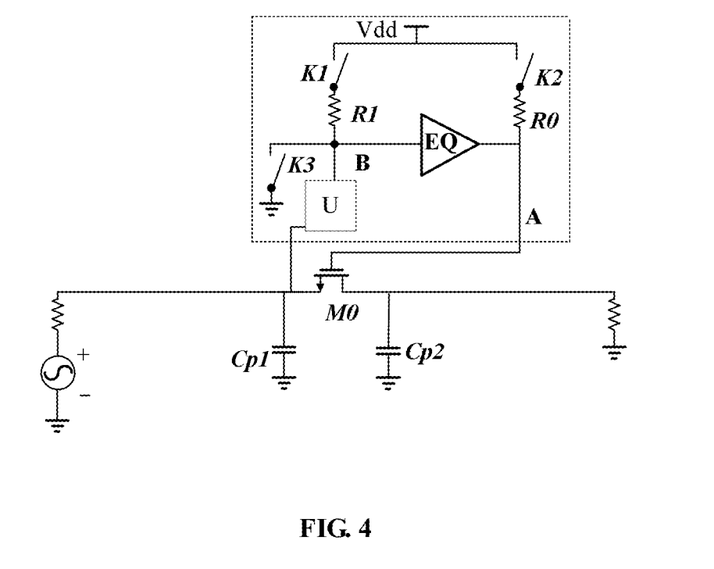
FIG. 4 is a schematic structural diagram of an equalization module according to an embodiment of the present disclosure.

FIG. 4 is a schematic structural diagram of an equalization module according to an embodiment of the present disclosure. Reference is made to FIG. 4, the equalization module 100 includes a first switch K1, a second switch K2, a third switch K3, a first resistor R0, a second resistor R1, an equalization amplifier EQ, and a signal detecting module U. A first terminal of the first switch K1 and a first terminal of the second switch K2 are connected to a power supply Vdd. The first resistor R0 serves as a load resistor of the equalization amplifier EQ. A first terminal of the first resistor R0 is connected to a second terminal of the second switch K2. A second terminal of the first resistor R0 is connected to an output terminal of the equalization amplifier EQ. A first terminal of the second resistor R1 is connected to a second terminal of the first switch K1. A second terminal of the second resistor R1 is connected to a first terminal of the third switch K3, a first terminal of the signal detecting module U, and an input terminal of the equalization amplifier EQ. A second terminal of the third switch K3 is grounded.

The output terminal of the equalization amplifier EQ serves as the output terminal of the equalization module 100 and is connected to the gate of the first MOS transistor M0. In the technical solutions according to the embodiments of the present disclosure, the equalization amplifier EQ is a current mode equalization amplifier. However, based on the design principle of the present disclosure, the current mode equalization amplifier may be replaced with a voltage mode equalization amplifier by those skilled in the art, which should fall within the scope of the present disclosure.

The signal detecting module U is configured to: detect an amplitude of the signal transmitted through the first MOS transistor M0; output from a first terminal of the signal detecting module U a signal for characterizing the amplitude of the signal transmitted through the first MOS transistor M0; and transmit the signal for characterizing the amplitude of the signal transmitted through the first MOS transistor M0 to the equalization amplifier EQ.

Specifically, in the technical solutions according to the embodiment shown in FIG. 4, the signal detecting module U may be a MOS transistor or a capacitor. In a case that the signal detecting module U a MOS transistor, reference is made to FIG. 5, which is a schematic structural diagram of the equalization module 100 according to another embodiment of the present disclosure. The signal detecting module U is a second MOS transistor M1, a gate of the second MOS transistor M1 serves as a first terminal of the signal detecting module U. The second MOS transistor M1 is connected to the first MOS transistor M0 in parallel. A size of the first MOS transistor M0 is larger than a size of the second MOS transistor M1. In a case that the signal detecting module U is a capacitor, reference is made to FIG. 6, which is a schematic structural diagram of an equalization module according to another embodiment of the present disclosure. The signal detecting module U is a capacitor C1, and a first terminal of the capacitor C1 serves as the first terminal of the signal detecting module U. A second terminal of the capacitor C1 is connected to the input terminal or the output terminal of the first MOS transistor M0.

Figure 5:
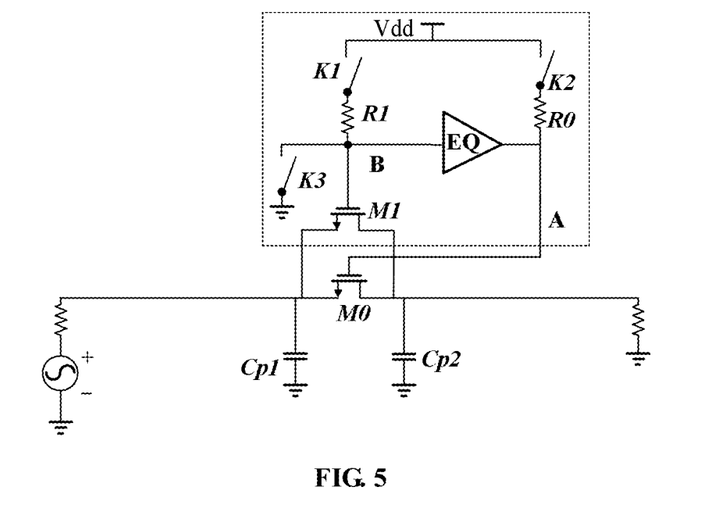
FIG. 5 is a schematic structural diagram of an equalization module according to another embodiment of the present disclosure.
Figure 6:
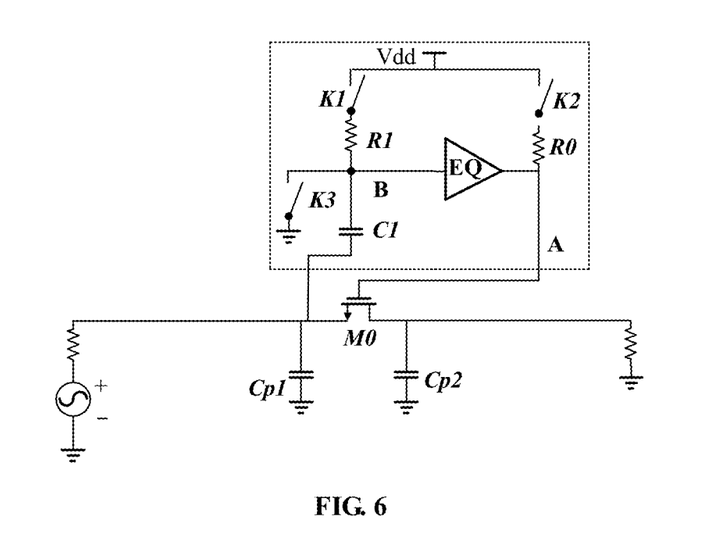
FIG. 6 is a schematic structural diagram of an equalization module according to another embodiment of the present disclosure.

Compared with the case that the signal detecting module U is the capacitor C1, in the case that the signal detecting module U is the second MOS transistor M1, the on-resistance in the signal path is further reduced. Therefore, in the technical solutions according to the embodiments of the present disclosure, the signal detecting module U is preferably the second MOS transistor M1. Further, in the embodiments and the drawings of the present disclosure, the case that the signal detecting module U is the second MOS transistor M1 is taken as an example. Specifically, the second MOS transistor M1 may be an NMOS transistor, a PMOS transistor or a CMOS transistor.

In the technical solutions according to the embodiment as shown in FIG. 5, in a specific design, the second resistor R1 is a large resistor with a resistance of at least an order of KΩ. A turn-off frequency of a high-pass filter formed by the second resistor R1 and a gate oxide capacitance of the second MOS transistor M1 is at least less than a lowest frequency of a fundamental component of a signal band in the signal path in which the first MOS transistor M0 is located.

Specifically, the technical solution according to the embodiment as shown in FIG. 5 is implemented as follows.

Figure 7:
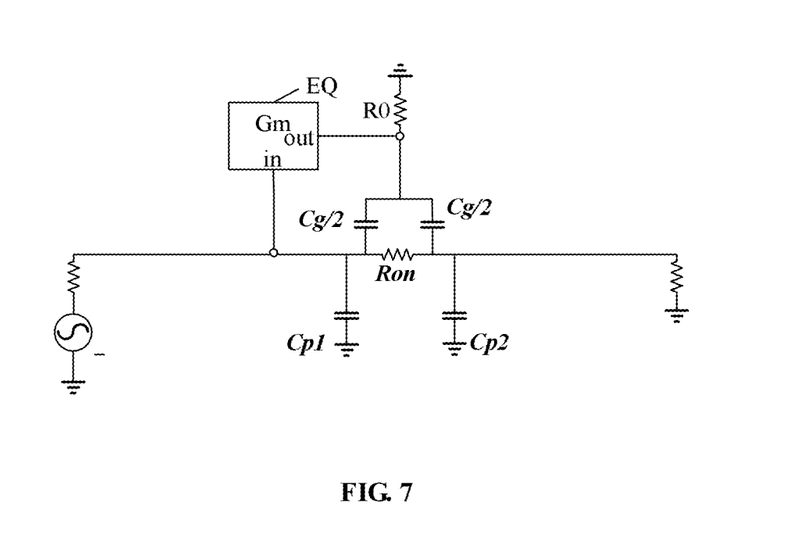
FIG. 7 is a schematic equivalent small-signal structural diagram of a switch circuit shown in FIG. 5.

In a case that the switch circuit is not in the operation state, the first switch K1 and the second switch K2 are turned off, and the third switch K3 is turned on, to set a voltage at a point B to be zero. The equalization amplifier EQ is turned off, and a voltage of an output node A of the equalization amplifier EQ is pulled down to be zero. In this case, the first MOS transistor M0 and the second MOS transistor M1 are turned off In a case that the switch circuit is in the operation state, the first switch K1 and the second switch K2 are turned on, and the third switch K3 is turned off In this case, the first MOS transistor M0 and the second MOS transistor M1 are turned on. In the case that the switch circuit is in the operation state, an equivalent small-signal diagram of the switch circuit shown in FIG. 5 is shown in FIG. 7. Since the turn-off frequency of the high-pass filter formed by the second resistor R1 and the gate oxide capacitance of the second MOS transistor M1 shown in FIG. 5 is less than the lowest frequency of the fundamental component of the signal band in the signal path in which the first MOS transistor M0 is located, reference is made to FIG. 7, a signal with a desired frequency band is deemed as an all-pass signal for a small-signal analysis. The equalization amplifier EQ shown in FIG. 5 is a current mode equalization amplifier, a transmission equation of which is denoted by Gm. The transmission equation Gm is used to characterizing a transconductance magnification of the equalization amplifier EQ on a signal.

Figure 8:
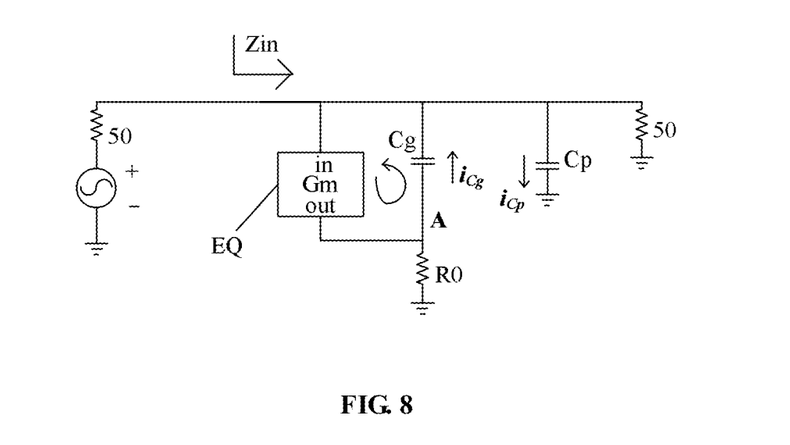
FIG. 8 is a schematic simplified equivalent small-signal diagram of the switch circuit shown in FIG. 5 in a case that an on-resistance Ron of a first MOS transistor M0 is negligible.

As described in the above, with the technical solutions of the present disclosure, the stray capacitance is compensated, and the on-resistance of the first MOS transistor is reduced by using the first MOS transistor with a large size. Therefore, the size of the first MOS transistor may be as large as possible, to increase a width of the first MOS transistor such that the on-resistance Ron is negligible. Reference is made to FIG. 8, which is a schematic simplified equivalent small-signal diagram of the switch circuit shown in FIG. 5 in a case that an on-resistance Ron of a first MOS transistor M0 is negligible. In the embodiment shown in FIG. 8, a stray capacitance Cp is a sum of a stray capacitance Cp1 and a stray capacitance Cp2, that is, Cp=Cp1+Cp2. In the designing process of the circuit, coefficients of the transmission equation Gm of the equalization amplifier EQ should meet the following two basic requirements.

Firstly, an impedance Zin of the system matches with terminating impedance (which is generally equal to 50 Ω) of the power supply. Therefore, it is desired that the gate oxide capacitance of the first MOS transistor M0 is negligible. In this case, the transmission equation Gm and a resistance R0 of the first resistor are adjusted, such that a product of the transmission equation Gm and the resistance value R0 of the first resistor is equal to one, that is, Gm*R0=1 (where R0 denotes the resistance of the first resistor). That is, a voltage at a point A changes completely following a voltage in the signal path. In this case, voltages at two ends of the gate oxide capacitance Cg of the first MOS transistor M0 are equal to each other, and no alternating current (AC) (that is, a current passing through the signal path) is leaked via the gate oxide capacitance Cg. Therefore, the gate oxide capacitance Cg is negligible in the system. Further, in a case that the product of the transmission equation Gm and the resistance R0 of the first resistor is increased, to increase the voltage at the point A, a current $i_{Cg}$ may be reversely supplied from the point A to the signal path in which the first MOS transistor M0 is located, to compensate the current $i_{Cp}$ in the signal in the signal path that is lost due to the stray capacitance Cp, thereby achieving a compensation on the loss of the signal. Further, in a case of Gm*R0=S*Cp*R0+1+Cp/Cg, the lost current $i_{Cp}$ can be completely compensated by the current $i_{Cg}$. In this case, in theory, not only influence of the gate oxide capacitance of the first MOS transistor M0 on the signal in the signal path is eliminated, but also the loss of the signal in the signal path due to other stray capacitances is completely compensated. In the above equation, Gm denotes a transconductance magnification of the equalization amplifier, R0 denotes a resistance of the first resistor, S denotes a complex frequency and is expressed by S=jω, where j denotes an imaginary number and ω denotes an angular frequency, Cp denotes a sum of capacitances-to-ground of generated at both sides of a first MOS transistor M0, and Cg denotes a gate oxide capacitance of the first MOS transistor.

Figure 9:
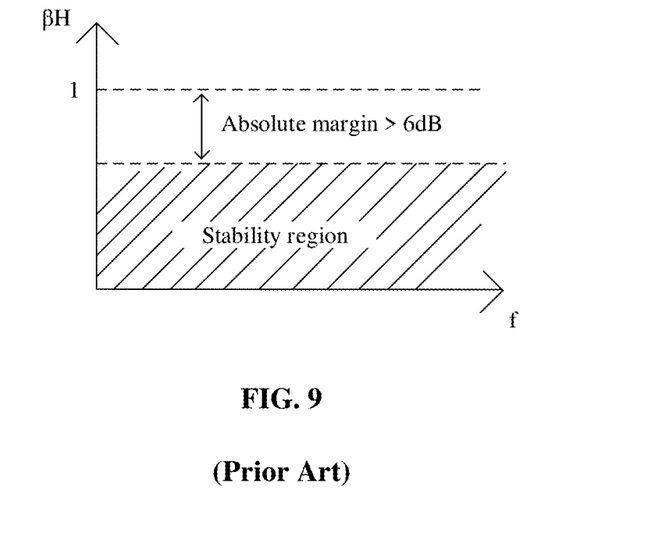
FIG. 9 is a schematic diagram showing a stability region of a loop gain according to the conventional technology.

Secondly, a loop shown in FIG. 8 should follow a stability requirement. For a positive feedback, a loop gain is generally less than one. Reference is made to FIG. 9, which is a schematic diagram showing a stability region of a loop gain according to the conventional technology. For the loop gain shown in FIG. 9, an absolute margin greater than 6 dB is required to be reserved. In a case of Gm*R0=S*Cp*R0+1+Cp/Cg, a loop gain βH is expressed by the following equation:

$$\beta H \approx \frac{25*S*Cp(R0*S*Cg+1)}{25*S*Cg+(R0*S*Cg+1)(1+25*S*Cp)}$$

Figure 10:
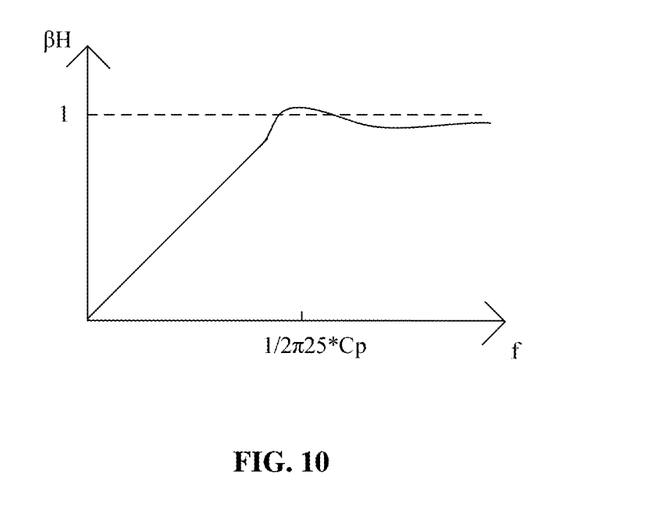
FIG. 10 is a schematic diagram showing a curve of a loop gain in a case that a stray capacitance generated in the first MOS transistor and all stray capacitances generated at both sides of the first MOS transistor are all compensated according to an embodiment of the present disclosure.
Figure 11:
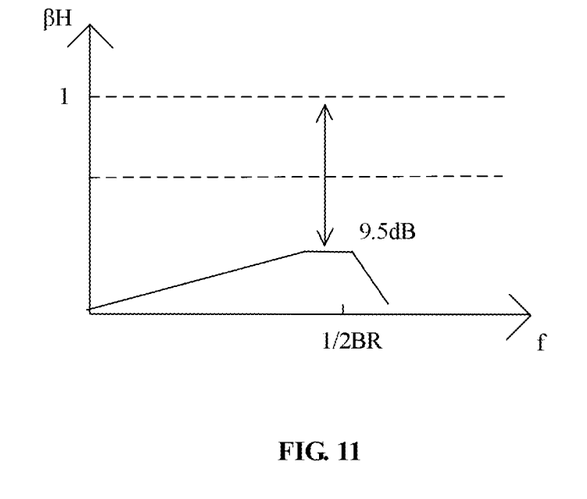
FIG. 11 is a schematic diagram showing a target loop gain in a switch circuit according to an embodiment of the present disclosure in a case of n=3.

Reference is made to FIG. 10, which is a schematic diagram showing a curve of a loop gain in a case that a stray capacitance generated in the first MOS transistor M0 and all stray capacitances generated at both sides of the first MOS transistor M0 are all compensated according to an embodiment of the present disclosure. As shown in the curve, in a case that the loop gain is approach to 1 in a case that the frequency is greater than 1/50 πCp, which may cause oscillation. Therefore, in the present disclosure, a compromise may be made between optimum compensation and the stability. For example, parameters of related devices are designed, to meet an equation Gm*R0=(S*Cp*R0+1+Cp/Cg)/n. A large n corresponds to a large stability margin of the loop. An expression of Gm reflects a design target for the transmission equation of the equalization module 100. A zero position of the gain curve can be accurately calculated. For a frequency band higher than an operation frequency of the high-pass filter in the signal path, no gain may be required, such that the stability is increased. Further, it is impossible that only a single zero point and no stray poles exist in an actual circuit. of n may be set to be greater than one according to user demands. In the technical solutions according to the embodiments of the present disclosure, n is preferably set to be three. A curve of a target loop gain of an actual circuit is as shown in FIG. 11. In a case of n=3, about 1/3 of loss caused by the gate oxide capacitance is compensated with the Gm. That is, a problem of the increased stray capacitance caused by the increased size of the first MOS transistor M0 is solved. Further, some of loss of the signal in the signal path caused by capacitances-to-ground of the ESD device and other circuits is compensated.

In the above technical solutions according to the embodiments of the present disclosure, the size of the first MOS transistor M0 may be designed as large as possible, and the equalization module 100 is directly connected to the gate of the first MOS transistor M0, to control the gate of the first MOS transistor M0, such that the attenuation of the high-frequency signal caused by the gate oxide capacitance of the first MOS transistor M0 is compensated. Therefore, the contradiction between the stray capacitance and the on-resistance Ron of the first MOS transistor M0 with an enlarged in size is eliminated. It can be seen from the above technical solutions that, the on-resistance Ron of the first MOS transistor M0 may be reduced by increasing the size of the first MOS transistor M0, so as to compensate the loss of the signal in the signal path caused by the on-resistance Ron.

Further, in the above technical solutions, the gate oxide capacitance is used to increase the current supplied to the signal path, such that some of the loss of the signal in the signal path caused by other stray capacitors is compensated, thereby optimizing the system performance.

Further, the above technical solutions in the present disclosure is obtained by modifying an infrastructure based on a passive switch, thus has features of the passive switch. For example, continuity of the signal path is not destroyed, no parsing on a signaling protocol is required, and no operation is performed on software and hardware for various high-speed modes and low-speed modes.

In addition, the gate oxide capacitance of the first MOS transistor with an increased size is fully used in the present disclosure, such that it is unnecessary to add additional AC capacitance in case that the equalization module 100 performs signal compensation, thereby saving an area of a chip.

Furthermore, corresponding to the above switch circuit, a high-speed multiplexer-demultiplexer is further provided in the present disclosure. The high-speed multiplexer-demultiplexer includes at least two switch circuits according to any one of the embodiments of the present disclosure. The high-speed multiplexer-demultiplexer may be implemented as a multiplex circuit or a demultiplex circuit. Alternatively, the high-speed multiplexer-demultiplexer may be implemented as other switch circuit for high-frequency signal.

The embodiments in this specification are described in a progressive way, each of which emphasizes the differences from others, and the same or similar parts among the embodiments can be referred to each other. Since the device disclosed in the embodiments corresponds to the method therein, the description thereof is relatively simple, and for relevant matters references may be made to the description of the method.

Embodiments of the disclosure are described above, so that those skilled in the art can implement or use the present disclosure. Various modifications to the embodiments are obvious to those skilled in the art, and general principles defined in this specification may be implemented in other embodiments without departing from the spirit or scope of the present disclosure. Therefore, the present disclosure is not limited to the embodiments described in this specification but accords with the widest scope that complies with the principles and novelty disclosed in this specification.

The invention claimed is:

1. A switch circuit, comprising: an equalization module and a first metal-oxide-semiconductor (MOS) transistor, wherein
   a gate of the first MOS transistor is connected to an output terminal of the equalization module, an input terminal of the first MOS transistor is connected to a signal source for acquiring a signal from the signal source, and an output terminal of the first MOS transistor is connected to a subsequent circuit; and
   the equalization module is configured to: supply a turning-on signal to the first MOS transistor in a case that an operation signal in response to which the switch circuit operates is acquired, to turn on the first MOS transistor; and generate, in a case that the first MOS transistor is turned on, a compensation signal for compensating an attenuation of the signal transmitted through the first MOS transistor, and apply the compensation signal to the gate of the first MOS transistor.

2. The switch circuit according to claim 1, wherein the equalization module comprises: a first switch, a second switch, a third switch, a first resistor, a second resistor, an equalization amplifier, and a signal detecting module, wherein
   a first terminal of the first switch and a first terminal of the second switch are connected to a power supply Vdd;

a first terminal of the first resistor is connected to a second terminal of the second switch, and a second terminal of the first resistor is connected to an output terminal of the equalization amplifier;

a first terminal of the second resistor is connected to a second terminal of the first switch, and a second terminal of the second resistor is connected to a first terminal of the third switch, a first terminal of the signal detecting module, and an input terminal of the equalization amplifier;

a second terminal of the third switch is grounded;

the output terminal of the equalization amplifier serves as the output terminal of the equalization module and is connected to the gate of the first MOS transistor; and the signal detecting module is configured to: detect an amplitude of the signal transmitted through the first MOS transistor; and output, from the first terminal of the signal detecting module, a signal for characterizing the amplitude of the signal transmitted through the first MOS transistor.

3. The switch circuit according to claim 2, wherein the signal detecting module comprises a second MOS transistor, wherein a gate of the second MOS transistor serves as the first terminal of the signal detecting module, and the second MOS transistor is connected to the first MOS transistor in parallel.

4. The switch circuit according to claim 3, wherein a size of the first MOS transistor is greater than a size of the second MOS transistor.

5. The switch circuit according to claim 2, wherein the signal detecting module comprises a first capacitor, wherein a first terminal of the first capacitor serves as the first terminal of the signal detecting module, and a second terminal of the first capacitor is connected to the input terminal or the output terminal of the first MOS transistor.

6. The switch circuit according to claim 2, wherein in a case that the switch circuit is in an operation state, the first switch and the second switch are turned on, and the third switch is turned off; and in a case that the switch circuit is not in the operation state, the first switch and the second switch are turned off, and the third switch is turned on.

7. The switch circuit according to claim 2, wherein design parameters of the equalization module, the first MOS transistor and the first resistor are determined according to the following equation:

$$Gm*R0 = S*Cp*R0 + 1 + Cp/Cg$$

wherein Gm denotes a transconductance magnification of the equalization amplifier, R0 denotes a resistance of the first resistor, S denotes a complex frequency, Cp denotes a sum of capacitances-to-ground generated at both sides of the first MOS transistor, and Cg denotes a gate oxide capacitance generated in the first MOS transistor.

8. The switch circuit according to claim 2, wherein design parameters of the equalization module, the first MOS transistor and the first resistor are determined according to the following equation:

$$Gm*R0 = (S*Cp*R0 + 1 + Cp/Cg)/n$$

wherein Gm denotes a transconductance magnification of the equalization amplifier, R0 denotes a resistance of the first resistor, S denotes a complex frequency, Cp denotes a sum of capacitances-to-ground generated at both sides of the first MOS transistor, Cg denotes a gate oxide capacitance generated in the first MOS transistor, and n>1.

9. The switch circuit according to claim 8, wherein n=3.

10. A high-speed multiplexer-demultiplexer, comprising:

at least two switch circuits, wherein each of the at least two switch circuits comprises: an equalization module and a first metal-oxide-semiconductor (MOS) transistor, and wherein a gate of the first MOS transistor is connected to an output terminal of the equalization module, an input terminal of the first MOS transistor is connected to a signal source for acquiring a signal from the signal source, and an output terminal of the first MOS transistor is connected to a subsequent circuit; and the equalization module is configured to: supply a turning-on signal to the first MOS transistor in a case that an operation signal in response to which the switch circuit operates is acquired, to turn on the first MOS transistor; and generate, in a case that the first MOS transistor is turned on, a compensation signal for compensating an attenuation of the signal transmitted through the first MOS transistor, and apply the compensation signal to the gate of the first MOS transistor.

11. The high-speed multiplexer-demultiplexer according to claim 10, wherein the equalization module comprises: a first switch, a second switch, a third switch, a first resistor, a second resistor, an equalization amplifier, and a signal detecting module, wherein a first terminal of the first switch and a first terminal of the second switch are connected to a power supply Vdd;

a first terminal of the first resistor is connected to a second terminal of the second switch, and a second terminal of the first resistor is connected to an output terminal of the equalization amplifier;

a first terminal of the second resistor is connected to a second terminal of the first switch, and a second terminal of the second resistor is connected to a first terminal of the third switch, a first terminal of the signal detecting module, and an input terminal of the equalization amplifier;

a second terminal of the third switch is grounded;

the output terminal of the equalization amplifier serves as the output terminal of the equalization module and is connected to the gate of the first MOS transistor; and the signal detecting module is configured to: detect an amplitude of the signal transmitted through the first MOS transistor; and output, from the first terminal of the signal detecting module, a signal for characterizing the amplitude of the signal transmitted through the first MOS transistor.

12. The high-speed multiplexer-demultiplexer according to claim 11, wherein the signal detecting module comprises a second MOS transistor, wherein a gate of the second MOS transistor serves as the first terminal of the signal detecting module, and the second MOS transistor is connected to the first MOS transistor in parallel.

13. The high-speed multiplexer-demultiplexer according to claim 12, wherein a size of the first MOS transistor is greater than a size of the second MOS transistor.

14. The high-speed multiplexer-demultiplexer according to claim 11, wherein the signal detecting module comprises a first capacitor, wherein a first terminal of the first capacitor serves as the first terminal of the signal detecting module, and a second terminal of the first capacitor is connected to the input terminal or the output terminal of the first MOS transistor.

15. The high-speed multiplexer-demultiplexer according to claim 11, wherein
in a case that the switch circuit is in an operation state, the first switch and the second switch are turned on, and the third switch is turned off; and
in a case that the switch circuit is not in the operation state, the first switch and the second switch are turned off, and the third switch is turned on.

16. The high-speed multiplexer-demultiplexer according to claim 11, wherein design parameters of the equalization module, the first MOS transistor and the first resistor are determined according to the following equation:

$$Gm*R0=S*Cp*R0+1Cp/Cg$$

wherein Gm denotes a transconductance magnification of the equalization amplifier, R0 denotes a resistance of the first resistor, S denotes a complex frequency, Cp denotes a sum of capacitances-to-ground generated at both sides of the first MOS transistor, and Cg denotes a gate oxide capacitance generated in the first MOS transistor.

17. The high-speed multiplexer-demultiplexer according to claim 11, wherein design parameters of the equalization module, the first MOS transistor and the first resistor are determined according to the following equation:

$$Gm*R0=(S*Cp*R0+1+Cp/Cg)/n$$

wherein Gm denotes a transconductance magnification of the equalization amplifier, R0 denotes a resistance of the first resistor, S denotes a complex frequency, Cp denotes a sum of capacitances-to-ground generated at both sides of the first MOS transistor, Cg denotes a gate oxide capacitance generated in the first MOS transistor, and n>1.

18. The high-speed multiplexer-demultiplexer according to claim 17, wherein n=3.

* * * * *